US009867284B2

(12) United States Patent
Kreutzwiesner et al.

(10) Patent No.: US 9,867,284 B2
(45) Date of Patent: Jan. 9, 2018

(54) WARPAGE CONTROL WITH INTERMEDIATE MATERIAL

(71) Applicant: AT & S Austria Technologie & Systemtechnik Aktiengesellschaft, Leoben (AT)

(72) Inventors: Elisabeth Kreutzwiesner, Graz (AT); Gernot Schulz, Graz (AT)

(73) Assignee: AT & S AUSTRIA TECHNOLOGIE & SYSTEMTECHNII, Loeben (AT)

( * ) Notice: Subject to any disclaimer, the term of this patent is extended or adjusted under 35 U.S.C. 154(b) by 0 days.

(21) Appl. No.: 15/501,829

(22) PCT Filed: Aug. 4, 2015

(86) PCT No.: PCT/EP2015/067970
§ 371 (c)(1),
(2) Date: Feb. 4, 2017

(87) PCT Pub. No.: WO2016/020389
PCT Pub. Date: Feb. 11, 2016

(65) Prior Publication Data
US 2017/0231086 A1    Aug. 10, 2017

(30) Foreign Application Priority Data
Aug. 5, 2014   (DE) ................. 10 2014 111 148

(51) Int. Cl.
*H05K 1/03*   (2006.01)
*H05K 1/02*   (2006.01)
(Continued)

(52) U.S. Cl.
CPC ......... *H05K 1/0271* (2013.01); *H05K 1/0207* (2013.01); *H05K 3/12* (2013.01);
(Continued)

(58) Field of Classification Search
CPC ...... H05K 1/03; H05K 1/0306; H05K 1/0313; H05K 1/032; H05K 1/0326; H05K 1/0333;
(Continued)

(56) References Cited

U.S. PATENT DOCUMENTS

2009/0008136 A1   1/2009   Ikeguchi et al.
2009/0151989 A1   6/2009   Hunrath
2014/0166348 A1   6/2014   Cho

FOREIGN PATENT DOCUMENTS

DE      10 393 851 B4    11/2007
EP       0 864 623 B1     8/2001
(Continued)

*Primary Examiner* — Jeremy C Norris
(74) *Attorney, Agent, or Firm* — Robert A. Blaha; Smith Tempel Blaha LLC

(57) ABSTRACT

A mounting device for mounting electronic components, wherein the mounting device comprises an electrically conductive structure having a first value of thermal expansion in at least one pre-defined spatial direction, an electrically insulating structure having a second value of thermal expansion in the at least one pre-defined spatial direction being different from the first value and being arranged on the electrically conductive structure, and a thermal expansion adjustment structure having a third value of thermal expansion in the at least one pre-defined spatial direction, wherein the third value is selected and the thermal expansion adjustment structure is located so that thermally induced warpage of the mounting device resulting from a difference between the first value and the second value is at least partially compensated by the thermal expansion adjustment structure.

20 Claims, 2 Drawing Sheets

(51) Int. Cl.
*H05K 3/46*    (2006.01)
*H05K 3/14*    (2006.01)
*H05K 3/16*    (2006.01)
*H05K 3/12*    (2006.01)

(52) U.S. Cl.
CPC ............ *H05K 3/146* (2013.01); *H05K 3/16* (2013.01); *H05K 3/4608* (2013.01); *H05K 3/4688* (2013.01); *H05K 2201/0195* (2013.01); *H05K 2201/0323* (2013.01); *H05K 2201/068* (2013.01); *H05K 2201/09136* (2013.01)

(58) Field of Classification Search
CPC .... H05K 1/034; H05K 1/0346; H05K 1/0353; H05K 1/036; H05K 1/0366; H05K 1/0373; H05K 1/038; H05K 1/0386; H05K 1/0393; H05K 1/05; H05K 1/053; H05K 1/056; H05K 1/0271
See application file for complete search history.

(56) References Cited

FOREIGN PATENT DOCUMENTS

| | | |
|---|---|---|
| KR | 101 309 342 B1 | 9/2013 |
| WO | WO 02/47899 A1 | 6/2002 |

WARPAGE CONTROL WITH INTERMEDIATE MATERIAL

This application claims the benefit of the filing date of German Patent Application No. 10 2014 111 148.6 filed 5 Aug. 2014, the disclosure of which is hereby incorporated herein by reference.

TECHNICAL FIELD

Embodiments of the invention relates to a mounting device, and a method of manufacturing a mounting device.

TECHNOLOGICAL BACKGROUND

In the context of growing product functionalities of mounting devices equipped with one or more electronic components and increasing miniaturization of such electronic components as well as a rising number of electronic components to be mounted on mounting devices such as printed circuit boards, increasingly more powerful array-like components or packages having several electronic components are being employed, which have a plurality of contacts or connections, with ever smaller spacing between these contacts. Removal of heat generated by such electronic components and the mounting device itself during operation becomes an increasing issue. At the same time, mounting devices shall be mechanically robust so as to be operable even under harsh conditions. As miniaturization and especially thickness reduction of mounting devices are further going on, uncontrolled bow and twist may occur in the event of temperatures varying over a broad range. This warpage may lead to registration problems, misplacing of components, adhesion problems, etc.

DE 103 93 851 B4 discloses a semiconductor element heat dissipation element comprising a semiconductor element which is arranged on an electrically insulating amorphous carbon film. The semiconductor element heat dissipation element further comprises a heat dissipation plate which may be made of metal and which is arranged between the electrically insulating amorphous carbon film and a cooling plate. The coefficient of thermal expansion (CTE) of the heat dissipation plate may be adjusted such that its value is between the CTE of the electrically insulating amorphous carbon film and the CTE of the cooling plate.

EP 0 864 623 B1 discloses a hot melt web for coating a solar module, an optical data carrier or a display. The hot melt web comprises a support made of a heat resistant resin and an adhesive in the form of a layer on the support. The heat resistant resin and the adhesive may be heat pressed on the surface of a solar cell module or the like, such that unwanted deformations and internal stresses of layers with different shrinkage factors may be corrected.

SUMMARY

There may be a need to provide a mounting device which allows to efficiently cope with thermal stress acting on the mounting device so as to suppress warpage of the mounting device.

In order to meet this need, a mounting device and a method of manufacturing a mounting device according to the independent claims are provided.

According to an exemplary embodiment of the invention, a mounting device for mounting electronic components (such as packaged semiconductor chips) is provided, wherein the mounting device comprises an electrically conductive structure having a first value of thermal expansion in at least one pre-defined spatial direction, an electrically insulating structure having a second value of thermal expansion in the at least one pre-defined spatial direction being different from (in particular smaller than) the first value and being arranged on the electrically conductive structure, and a thermal expansion adjustment structure (in particular in and/or on the electrically conductive structure) having a third value of thermal expansion in the at least one pre-defined spatial direction, wherein the third value is selected and the thermal expansion adjustment structure is located (in particular within the mounting device) so that thermally induced warpage (i.e. warpage resulting from different thermal expansion of different materials of the mounting device in the at least one pre-defined spatial direction) of the mounting device resulting from a difference between the first value and the second value is at least partially compensated (in particular is smaller than in an identical mounting device but lacking the thermal expansion adjustment structure) by the thermal expansion adjustment structure.

According to another exemplary embodiment of the invention, a method of manufacturing a mounting device for mounting electronic components is provided, wherein the method comprises providing an electrically conductive structure having a first value of thermal expansion in at least one pre-defined spatial direction, arranging an electrically insulating structure on the electrically conductive structure, wherein the electrically insulating structure has a second value of thermal expansion in the at least one pre-defined spatial direction being different from (in particular smaller than) the first value, forming a thermal expansion adjustment structure (particular in and/or on the electrically conductive structure) having a third value of thermal expansion in the at least one pre-defined spatial direction, and selecting the third value and locating the thermal expansion adjustment structure so that thermally induced warpage of the mounting device resulting from a difference between the first value and the second value is at least partially compensated by the thermal expansion adjustment structure.

In the context of the present application, a "mounting device" may denote a (particularly plate shaped) body which has one or more electrically insulating structures and one or more electrically conductive structures, in particular on at least one surface of the mounting device. Such a mounting device may serve as a basis for mounting one or more electronic components (such as packaged electronic chips, active and/or passive electronic members, sockets, etc.) thereon and/or therein and serves both as a mechanical support platform and an electrically wiring arrangement.

In the context of the present application, the term "value of the thermal expansion" may denote a value of the thermal expansion coefficient or coefficient of thermal expansion (CTE) in a corresponding spatial direction. It may be indicative of an amount of an increase (or decrease) of a geometric or physical extension of a structural component of the mounting device as a result of the increase (or decrease) of the temperature by a certain value. In particular, the term "value of the thermal expansion" may denote a positive linear expansion coefficient along the respective spatial direction, more particularly at 20° C. For some materials (such as copper as an example for an electrically conductive structure), the value of the thermal expansion is isotropic or at least substantially isotropic, i.e. exactly or approximately the same in all spatial directions. For other materials (such as FR4 as an example for an electrically insulating structure), the value of the thermal expansion is anisotropic, i.e. significantly different in different spatial directions.

In the context of the present application, the term "thermally induced warpage" may denote bow and/or twist of the mounting device which results conventionally, in the event of temperature changes, from unbalanced different values of the thermal expansion of different structural components of the mounting device.

In the context of the present application, the term "thermal expansion adjustment structure" may denote one or more physical bodies interposed between different structural components (such as the electrically conductive structure and/or the electrically insulating structure) of the mounting device and/or embedded within one or more of such structural components. Such a thermal expansion adjustment structure may be located at an appropriate position and may be configured with regard to its material properties to respond to a change of the temperature with a corresponding expansion or compression which at least partially compensates mechanical stress within the mounting device as a consequence of different thermal expansion behavior of the other structural components of the mounting device. Corresponding design parameters are the material used for the thermal expansion adjustment structure, because this has a quantitative impact on the amount and/or direction of the compensation effect, and the position of the thermal expansion adjustment structure within the mounting device, because this defines the location at which the stress-compensating and warpage-suppressing effect of the thermal expansion adjustment structure impacts the mounting device.

According to an exemplary embodiment, a thermal expansion adjustment structure is integrated within a mounting device in order to at least partially compensate for or balance out mounting device internal stress, in particular at or close to the interface between different materials, such as materials of the electrically conductive structure and the electrically insulating structure. When different thermal expansion properties of such materials generate intrinsic forces within the mounting device, this may conventionally result in a structural decomposition (such as a bending or even breaking) and/or delamination between components of such different materials and/or twist and bow effects of the mounting device. This limits both the lifetime of conventional mounting devices as well as the range of applications for conventional mounting devices. The thermal expansion adjustment structure according to an exemplary embodiment may be located and configured in terms of material selection within the mounting device so that the mentioned thermally induced stress is reduced or even eliminated. This may be achieved by configuring the thermal expansion adjustment structure as a stiffener structure distributing the expansion forces over the mounting device. It is also possible that the thermal expansion adjustment structure generates counter forces and shows an inverse thermal and stress generating behavior than the structural components of the mounting device generating the mechanical stress to be balanced out.

In the following, further exemplary embodiments of the mounting device and the method will be explained.

In an embodiment, the mounting device is configured as a plate with a thickness extending in a so-called z-direction and having a length in a so-called x-direction and a width in a so-called y-direction being both larger than the thickness. The x-, y- and z-directions may be perpendicular to one another. In particular, the extensions of the mounting device in both the x-direction and the y-direction may be at least five times, in particular at least ten times, the extension of the mounting device in z-direction. For instance, the extension in the x-direction and in the y-direction may be in a range between 1 cm and 20 cm. The extension in the z-direction may be in a range between 0.5 mm and 3 mm. Particular such flat plates may be specifically prone to warpage in the presence of thermal loads, since this geometry results in large absolute values of the expansion in the xy-plane while the thin configuration along the z-direction cannot always provide sufficient load bearing capacity to cope with the resulting twist and bow forces acting on the plate.

In an embodiment, the at least one predefined spatial direction comprises at least one of the x-direction and the y-direction. In view of the large spatial extensions of a plate-shaped mounting device in the x-direction and the y-direction, even relatively small differences in the thermal expansion within the xy-plane may generate significant warpage. Thus, a compensation within the xy-plane is particularly advantageous.

Additionally or alternatively, the at least one predefined spatial direction comprises the z-direction. Widely used materials for mounting devices such as printed circuit boards, in particular FR4 (i.e. a material comprising resin with anisotropically aligned glass fibers), may have an extraordinarily high thermal expansion along the thickness extension of the plate shaped mounting device. Thus, warpage control along this direction may be advantageous as well.

In an embodiment, the third value is selected to be smaller than the first value, in particular smaller than both the first value and the second value. Specifically when the thermal expansion adjustment structure is embedded within the electrically conductive structure and has the smallest thermal expansion value among the group of the electrically conductive structure, the electrically insulating structure and the thermal expansion adjustment structure, it may provide locally constricted stiffness and a small intrinsic thermal expansion. This has turned out to particularly efficiently reduce warpage problems.

In an embodiment, the electrically conductive structure comprises or consists of copper. Copper is highly appropriate due to its high electrical and thermal conductivity while having a substantially isotropic coefficient of thermal expansion. However, alternative materials are possible for the electrically conductive structure, such as an aluminum or nickel.

In an embodiment, the electrically insulating structure comprises or consists of at least one of the group consisting of resin, prepreg, FR4, and resin-soaked glass fibers. In particular, the electrically insulating structure may be or may be based on prepreg material (such as a prepreg sheet or prepreg islands). Such prepreg material may form at least partially an electrically insulating structure of a glass fiber reinforced epoxy-based resin and may be shaped as a for instance patterned plate or sheet. Prepreg may be denoted as a glass fiber mat soaked by resin material and may be used for an interference fit assembly for the manufacture of mounting devices such as printed circuit boards. FR4 may designate a glass-reinforced epoxy material, for instance shaped as laminate sheets, tubes, rods, or plates. FR4 is a composite material composed of woven fiberglass cloth with an epoxy resin binder that is flame resistant. Such materials show a high anisotropy in terms of thermal expansion, with a pronounced high value in z-direction. However, since they have a smaller thermal expansion value in the xy-plane of a plate shaped mounting device than copper which can be used as preferred material for the electrically conductive structure, the performance of the mounting device in terms of thermal stability is significantly improved by the provision of the thermal expansion adjustment structure.

In an embodiment, the thermal expansion adjustment structure comprises or consists of one of the group consisting of diamond-like carbon (DLC), a nitride (in particular a metal nitride such as aluminum nitride, etc.), and an oxide (in particular a metal oxide such as aluminum oxide, zinc oxide, etc.).

In the context of the present application, the term "diamond-like carbon" (DLC) may be denoted as a mixture of different forms of amorphous and/or crystalline carbon materials which may have both graphitic and diamond like characteristics. DLC may contain adjustable (for instance by selecting a certain DLC production method and/or by correspondingly adjusting process parameters of a selected production method) amounts of $sp^2$ hybridized carbon atoms and/or $sp^3$ hybridized carbon atoms. By mixing these polytypes in various ways at the nanoscale level of structure, a DLC structure as thermal expansion adjustment structure can be made that at the same time is amorphous, flexible, and yet of $sp^3$ bonded diamond type.

In an embodiment, the electrically conductive structure, the electrically insulating structure, and the thermal expansion adjustment structure constitute a layer sequence or a stack of layers. By forming these three structural components of the mounting device as a stack of thin (continuous and/or patterned) layers, a thin plate shaped mounting device may be obtained, such as appropriate for many applications in terms of mounting electronic components in view of its large mounting surface and light weight. In particular with such layer shaped components, warpage problems in the xy-plane may become specifically pronounced and can be efficiently suppressed by the thermal expansion adjustment structure according to an exemplary embodiment.

In an embodiment, the thermal expansion adjustment structure is embedded, in particular symmetrically, between different spatially separated sections of the electrically conductive structure. By such a central location of the thermal expansion adjustment structure, a symmetric suppression of thermally induced bow and twist may be advantageously achieved on both sides thereof.

In an embodiment, the mounting device further comprises an adhesion promoting structure directly between the thermal expansion adjustment structure and the electrically conductive structure (and/or the electrically insulating structure) and configured for promoting adhesion of the thermal expansion adjustment structure on the electrically conductive structure (and/or the electrically insulating structure). The adhesion promoting structure may be arranged in direct contact with both the thermal expansion adjustment structure and the electrically conductive structure (and/or the electrically insulating structure). In the context of the present application, an "adhesion promoting structure" may particularly denote an additive or a primer material formed or to be formed on the electrically conductive structure (and/or the electrically insulating structure) to promote adhesion of the thermal expansion adjustment structure on the electrically conductive structure (and/or the electrically insulating structure) with the adhesion promoting structure in between. Such an adhesion promoter may have an affinity for the electrically conductive structure (and/or the electrically insulating structure) and the thermal expansion adjustment structure. Without the adhesion promoter, the bonding properties of the applied thermal expansion adjustment structure would, for certain preferred materials of the thermal expansion adjustment structure such as DLC on certain preferred materials of the thermally conductive structure such as copper, not be sufficient to meet the performance requirements of the mounting device such as a printed circuit board. This sandwich composition overcomes the technical challenge that many thermal expansion adjustment structures, which may advantageously contribute to the suppression of warpage problems within the mounting device generated during temperature cycles, do not properly adhere directly on the electrically conductive structure so that, without an adhesion promoting structure. For such material configurations, the adhesion promoting structure helps to obtain a mounting device which is appropriate to withstand also very high mechanical stress exerted to the mounting device during normal use. By interposing the adhesion promoting structure between the electrically conductive structure and the thermal expansion adjustment structure, however, a mechanically robust mounting device can be obtained. In a scenario, in which direct adhesion between the thermal expansion adjustment structure and the electrically insulating structure of the mounting device is poor in view of a corresponding pair of materials, the provision of an adhesion promoting structure in between may also be advantageous.

In an embodiment, the adhesion promoting structure comprises or consists of at least one of the group consisting of titanium, tungsten, chromium, a carbide builder, and a carbon composite. However, also other materials may be used depending on the material pair of the electrically conductive structure and of the thermal expansion adjustment structure, provided that the adhesion between these two materials can be improved by such a material.

In an embodiment, the electrically conductive structure comprises two spatially separated sections arranged on two opposing sides, in particular on two opposing main surfaces, of the thermal expansion adjustment structure (optionally with an adhesion promoting structure in between), and the electrically insulating structure comprises two spatially separated sections arranged on two opposing sides, in particular on two exposed main surfaces, of the two sections of the electrically conductive structure. For instance, the two spatially separated sections of the electrically conductive structure may be two separate metal foils between which a layer of the thermal expansion adjustment structure may be sandwiched. On this arrangement, two layers of the electrically insulating structure, for instance two prepreg layers or two FR4 layers, may be arranged, for instance may be pressed. By this architecture, a large mounting surface for mounting electronic components may be obtained.

In an embodiment, the two sections of the electrically conductive structure, the two sections of the electrically insulating structure, and the thermal expansion adjustment structure form a symmetric arrangement, in particular a symmetric arrangement perpendicular to the at least one pre-defined spatial direction. This geometrically symmetric arrangement transfers into a symmetric arrangement in terms of thermally induced force distribution over the mounting device. This efficiently suppresses warpage problems and particularly eliminates local peaks of mechanical load.

In an embodiment, the thermal expansion adjustment structure is made of a thermally conductive and electrically insulating material. When configured of a thermally conductive and electrically insulating material (such as DLC), the thermal expansion adjustment structure contributes also significantly to the removal of heat generated during operation of the mounting device, while maintaining a high freedom for a circuit designer to configure the mounting device for a certain electronic application in view of the electrical isolation provided by the thermal expansion adjustment structure.

In an embodiment, the thermal expansion adjustment structure is made of a material having a value of the thermal conductivity of at least 2 W/m K, in particular of at least 50 W/m K, more particularly of at least 400 W/m K. Such values of the thermal conductivity are significantly better than the thermal conductivity of conventionally used electrically insulating materials (for instance FR4: ≈0.3 W/mK) of mounting devices such as printed circuit boards, which therefore significantly improves the heat removal from the mounting device during operation of the mounting device with electronic components (such as packaged semiconductor chips, etc.) mounted thereon.

In an embodiment, the electrically insulating structure is made of a material having anisotropic properties in terms of thermal expansion. For instance, FR4 may be a material with such strong anisotropic properties in view of anisotropically aligned glass fibers in it.

In an embodiment, the mounting device comprises at least one further electrically conductive structure and/or at least one further electrically insulating structure on the electrically insulating structure and/or on the electrically conductive structure. Thus, by providing further electrically conductive structures and/or electrically insulating structures, substantially any desired mounting device even for sophisticated electronic applications may be constructed. The connection of the individual components may be performed by pressing and/or applying thermal energy, to thereby form an interference fit assembly.

In an embodiment, the mounting device is configured as a multilayer substrate. Such a multilayer substrate may be manufactured by pressing the layered components to one another and allows to obtain a high mounting surface while simultaneously keeping the device thin and therefore lightweight and compact.

In an embodiment, the mounting device is configured as one of the group consisting of a circuit board (for instance a printed circuit board), an interposer, and a substrate.

In the context of the present application, a "circuit board" may denote a particularly plate shaped body which has an electrically insulating core and electrically conductive structures on at least one surface of the circuit board. Such a circuit board may serve as a basis for mounting electronic members thereon and/or therein and serves both as a mechanical support platform and an electrically wiring arrangement.

In the context of the present application, a "printed circuit board" (PCB) may denote a board of an electrically insulating core (in particular made of a compound of glass fibers and resin) covered with electrically conductive material and conventionally serving for mounting thereon one or more electronic members (such as packaged electronic chips, sockets, etc.) to be electrically coupled by the electrically conductive material. More specifically, a PCB may mechanically support and electrically connect electronic components using conductive tracks, pads and other features etched from metal structures such as copper sheets laminated onto an electrically non-conductive substrate. PCBs can be single sided (i.e. may have only one of its main surfaces covered by a, in particular patterned, metal layer), double sided (i.e. may have both of its two opposing main surfaces covered by a, in particular patterned, metal layer) or of multi-layer type (i.e. having also one or more, in particular patterned, metal layers in its interior). Conductors on different layers may be connected to one another with holes filled with electrically conductive material, which may be denoted as vias. The corresponding holes (which may be through holes or blind holes) may be formed for instance mechanically by boring, or by laser drilling. PCBs may also contain one or more electronic components, such as capacitors, resistors or active devices, embedded in the electrically insulating core. In particular for PCBs, a graphene structure (for instance a graphene monolayer or any other carbon composition having graphene-like properties) may be embedded as an adhesion promoting structure.

In the context of the present application, an "interposer" may denote an electrical interface device routing between one connection to another. A purpose of an interposer may be to spread a connection to a wider pitch or to reroute a connection to a different connection. One example of an interposer is an electrical interface between an electronic chip (such as an integrated circuit die) to a ball grid array (BGA).

In the context of the present application, a "substrate" may denote a physical body, for instance comprising a ceramic material, onto which electronic components are to be mounted. Such substrates may comprise one or more amorphous materials, such as for instance glass.

In an embodiment, the thermal expansion adjustment structure is configured only as a partial layer having, in a viewing direction perpendicular to a main surface of the mounting device, a total area being smaller than a surface area of the main surface of the mounting device. By configuring the thermal expansion adjustment structure (in particular when being configured as a DLC layer, diamond like carbon) as a partial layer within the mounting device or a partial coating of the electrically conductive structure and/or electrically insulating structure, the mechanical impact of the thermal expansion adjustment structure can be maintained relatively low, so that the warpage compensation does not result in a weaker mechanical robustness.

In an embodiment, the thermal expansion adjustment structure is formed by one of the group consisting of physical vapor deposition (PVD), cathodic arc deposition (ARC), chemical vapour deposition (CVD), plasma enhanced chemical vapour deposition (PECVD), and printing. In particular, the formation may be performed by ARC, which is a physical vapor deposition technique in which an electric arc is used to vaporize material from a cathode target. Thus, the thermal expansion adjustment structure may be formed by deposition on an underlying substrate. It is however also possible to form the thermal expansion adjustment structure by printing.

In an embodiment, the third value is selected so that the electrically conductive structure and the thermal expansion adjustment structure as a composite have an effective value of the thermal expansion in the at least one pre-defined spatial direction which is closer to the second value than the first value, in particular which deviates from the first value by less than about 10%, more particularly which substantially equals to the second value. In particular in an embodiment, in which the electrically conductive structure and the thermal expansion adjustment structure are formed in close spatial relationship to one another (for instance the one being embedded within the other, or both structures arranged directly juxtaposed) they may effectively function as one composite within the framework of the mounting device. If this composite is formed with a net or effective value of the value of the thermal expansion (for instance in one spatial direction, or averaged over all spatial directions) which is sufficiently similar to a corresponding value of the thermal expansion of the electrically insulating structure, warpage problems can be efficiently avoided or even completely eliminated. For instance, the effective value of the thermal expansion of this composite made deviate by less than 20%, in particular by less than 10%, from the value of the thermal expansion of the electrically insulating structure.

In an embodiment, the method further comprises estimating (for instance measuring and/or simulating) thermally induced warpage of a (for instance conventional or to-be-improved) mounting device without a thermal expansion adjustment structure, estimating (for instance measuring and/or simulating) thermally induced warpage of a to-be-designed-mounting device according to an exemplary embodiment having a thermal expansion adjustment structure, modifying the third value of the thermal expansion adjustment structure and/or modifying location of the thermal expansion adjustment structure in the to-be-designed-mounting device until an estimated thermally induced warpage of the to-be-designed-mounting device meets at least one predefined quality criterion in term of warpage characteristics (wherein the at least one predefined quality criterion may define a still acceptable amount of warpage, such as twist and bow, of the to-be-designed-mounting device with the to-be-designed thermal expansion adjustment structure), and manufacturing the to-be-designed-mounting device meeting the at least one predefined quality criterion by carrying out the procedure having the above-mentioned features. In order to configure the material and/or the position of the thermal expansion adjustment structure for reducing (in particular minimizing) warpage, it is possible to apply a simple trial and error approach, or to use expert knowledge and/or a warpage model and/or experimental evidence. The virtual mounting device developed by this estimation and modifying procedure (which can be repeated iteratively) may then be converted into a physical mounting device by carrying out the manufacturing procedure to obtain a mounting device with the properties in accordance with the to-be-designed mounting device.

The aspects defined above and further aspects of embodiments of the invention are apparent from the examples of embodiment to be described hereinafter and are explained with reference to these examples of embodiment.

BRIEF DESCRIPTION OF THE DRAWINGS

Embodiments of the invention will be described in more detail hereinafter with reference to examples of embodiment but to which the invention is not limited.

DETAILED DESCRIPTION OF EXEMPLARY EMBODIMENTS

Figure 1:
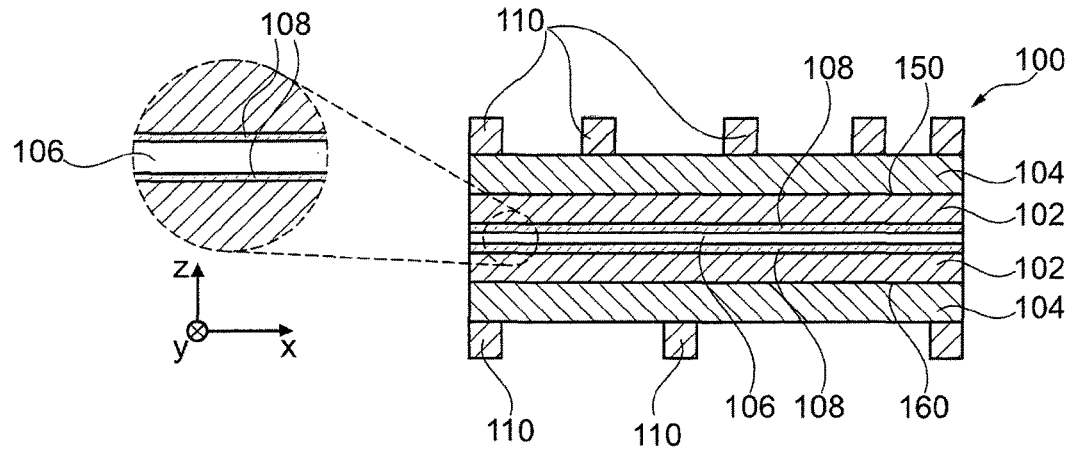
FIG. 1 illustrates a cross sectional view of a mounting device according to an exemplary embodiment of the invention.

The illustrations in the drawings are schematical. In different drawings, similar or identical elements are provided with the same reference signs.

Before exemplary embodiments will be described in further detail referring to the figures, some general considerations of the present inventors will be presented based on which exemplary embodiments have been developed.

As miniaturization of substrates and especially thickness reduction are further going on, uncontrolled bow and twist due to different coefficients of thermal expansion (CTE) values of used materials in a build-up may occur. This warpage leads in following processes, like assembly, to registration problems, misplacing of components, adhesion problems while stencil printing, etc. Therefore, a balanced build up and an equal amount of used materials are advantageous to avoid such problems caused by various CTE values. According to an exemplary embodiment of the invention, one or more thermal expansion adjustment structures (such as intermediate layers) with low CTE values act in such build-ups as a stiffener layer and distribute the expansion force over the whole substrate area while other materials with a higher CTE value are forced to stay in form. Finding a compromise between all used materials to maintain functionality and control warpage is one possible target in this context.

According to an exemplary embodiment, at least one intermediate layer as thermal expansion adjustment structure is deposited via various processes (such as PVC, ARC, printing technologies, CVD) on certain inner copper layers or other electrically conductive structures of multilayer substrates. The layer forming the thermal expansion adjustment structure can be on the full area or just on specific areas, with masking the areas, of the substrate. Warpage control may be realized due to the selection of a low CTE value of the intermediate layer in a defined thickness. The for instance layer-shaped thermal expansion adjustment structure can be any material like amorphous carbon material, nitrides or oxides or a stoichiometric or non-stoichiometric mixture of these and/or other materials.

When CTE values of exemplary materials are compared: FR4 (as an example for a material for the electrically insulating structure) shows the following values of thermal expansion (wherein the x- and the y-axis are mainly influenced by glass fibres):

CTE—x-axis: $14\ 10^{-6}\ K^{-1}$
CTE—y-axis: $12\ 10^{-6}\ K^{-1}$
CTE—z-axis: $70\ 10^{-6}\ K^{-1}$ Copper (as an example for a material of the electrically conductive structure):

CTE: $16\ 10^{-6}\ K^{-1}$

DLC (as an example for a material for the thermal expansion adjustment structure):

CTE: $<4\ 10^{-6}\ K^{-1}$

Hence, the CTE values of copper and FR4 are significantly different and this causes bow and twist. According to an exemplary embodiment of the invention, such problems are suppressed or even fully eliminated by placing a thermal expansion adjusting material in between such layers of copper and FR4 which balances the different expansion, and consequently the effect of bow and twist. Copper does not adhere properly on DLC so an adhesion promoter like Ti, W other carbide builder or carbon composites may be used and may be deposited also with PVD, ARC, CVD or similar processes.

Hence, exemplary embodiments of the invention provide a warpage control to realize asymmetric build-ups and as a consequence of very thin substrates. Embodiments of the invention may be implemented particularly advantageously for providing substrates with embedded components and for very thin substrates.

FIG. 1 illustrates a cross sectional view of a mounting device 100 according to an exemplary embodiment of the invention.

The mounting device 100 is here embodied as a printed circuit board (PCB) and is configured for mounting electronic components (not shown) on one or both opposing main surfaces thereof. As can be seen in FIG. 1, the mounting device 100 is configured as a multilayer substrate or plate with a thickness extending in z-direction and having a length in x-direction and a width in y-direction (which is the direction perpendicular to the paper plane of FIG. 1) being both several times larger than the thickness.

The mounting device 100 comprises an electrically conductive structure 102 which is here configured as two parallel aligned copper foils. Copper has a linear coefficient of thermal expansion of approximately $16 \cdot 10^{-6}$ $K^{-1}$ as a first value of thermal expansion in all three orthogonal spatial directions x, y and z.

Moreover, the mounting device 100 comprises an electrically insulating structure 104 composed of two parallel oriented layers of FR4 material, i.e. glass fibers in a resin matrix. The electrically insulating structure 100 has a second value of thermal expansion in both the x-direction and the y-direction which is smaller than the first value. In x-direction, this value is approximately $14 \cdot 10^{-6}$ $K^{-1}$, and in y-direction this value is approximately $12 \cdot 10^{-6}$ $K^{-1}$. In view of the anisotropic properties of FR4 material, the coefficient of thermal expansion of the FR4 material is approximately $70 \cdot 10^{-6}$ $K^{-1}$ in z-direction. Each of the electrically insulating layers of the electrically insulating structure 104 is located directly on a corresponding exposed main surface of a respective one of the copper foils.

Figure 4:
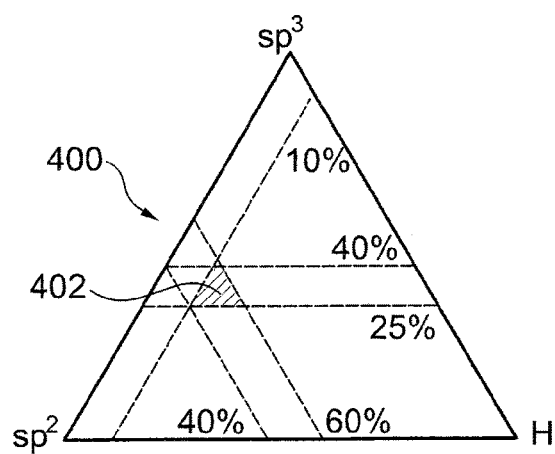
FIG. 4 illustrates a phase diagram indicating contributions of $sp^2$ hybridized carbon, $sp^3$ hybridized carbon and hydrogen of a carbon comprising thermal expansion adjustment structure of a mounting device according to an exemplary embodiment of the invention, wherein mechanical and thermal properties of the mounting device may be adjusted by configuring a manufacturing procedure in accordance with a desired section of the phase diagram.

A thermal expansion adjustment structure 106, here advantageously made of diamond like carbon (DLC), is positioned embedded within the electrically conductive structure 102, i.e. between the two copper foils, and has a third value of thermal expansion in all three spatial dimensions x, y, and z, i.e. an isotropic linear coefficient of thermal expansion of for instance about $2-3 \cdot 10^{-6}$ $K^{-1}$ (wherein the exact value depends on the exact composition of the DLC, which can be adjusted as illustrated in FIG. 4). Since DLC has a high thermal conductivity and is electrically insulating, it contributes to the removal of heat during operation of the mounting device 100 and nevertheless does not disturb the transmission of electric signals in view of its dielectric properties.

This third value is hence selected to be smaller than both the first value and the second value, and the thermal expansion adjustment structure 106 is positioned symmetrically within the electrically conductive structure 102 so that thermally induced warpage of the mounting device 100 resulting from a difference between the first value and the second value is at least partially compensated by the thermal expansion adjustment structure 106. Thus, the thermal expansion adjustment structure 106 with its small CTE and its central location within the symmetric layer stack of FIG. 1 serves as a stiffener and compensates at least partially the different thermal expansion characteristics of copper on the one hand and FR4 on the other hand in the xy-plane. In particular, a composite formed by the thermal expansion adjustment structure 106 in combination with the electrically conductive structure 102 has substantially the same thermal expansion properties in the xy-plane as the electrically insulating structure 104. Therefore, undesired twist and bow phenomena of the plate shaped mounting device 100 are substantially prevented thanks to the presence of the thermal expansion adjustment structure 106.

In order to improve adhesion of the thermal expansion adjustment structure 106 on the electrically conductive structure 102, the mounting device 100 further comprises two layers constituting an adhesion promoting structure 108 between the thermal expansion adjustment structure 106 and the electrically conductive structure 102 for promoting adhesion of the thermal expansion adjustment structure 106 on the electrically conductive structure 102. In the shown embodiment, the adhesion promoting structure 108 comprises a carbide builder. Each of the two separate layers of the adhesion promoting structure 108 is sandwiched respectively between the central thermal expansion adjustment structure 106 and a respective one of the two copper foils constituting the electrically conductive structure 102. Thus, the layers 106, 108, 102, 104 form an axially symmetric structure.

The mounting device 100 furthermore comprises patterned copper layers on each of the opposing layers of the electrically insulating structure 104, the patterned copper layers constituting a further electrically conductive structure 110.

Interfaces 150, 160 between mutually contacting main surfaces of the electrically conductive structure 102 and the electrically insulating structure 104 are positions at which, additionally or alternatively to the shown thermal expansion adjustment structure 106, one or more thermal expansion adjustment structures with corresponding properties may be foreseen. By providing plural thermal expansion adjustment structures 106 in one mounting device 100, it is possible to further refine adjustment of the thermal expansion (and related mechanical load) properties of the mounting device 100.

Figure 2:
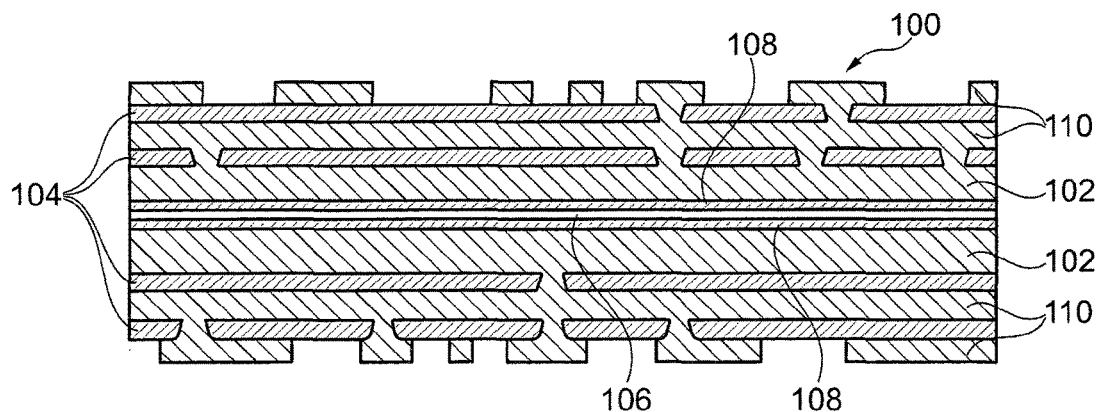
FIG. 2 illustrates a cross sectional view of a mounting device according to another exemplary embodiment of the invention.

FIG. 2 illustrates a cross sectional view of a mounting device 100 according to another exemplary embodiment of the invention. According to the mounting device 100 shown in FIG. 2, further patterned/continuous structures of electrically conductive material/electrically insulating material are provided in addition to the mounting device 100 shown in FIG. 1.

Figure 3:
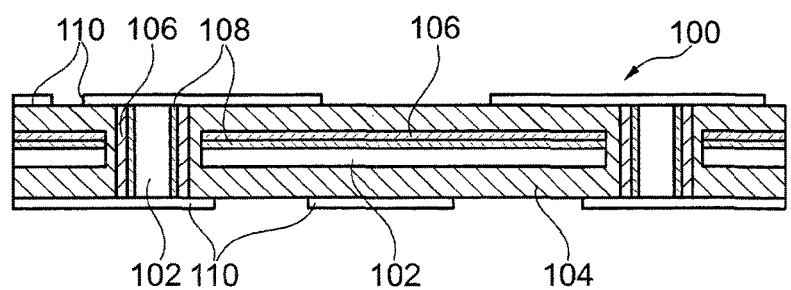
FIG. 3 illustrates a cross sectional view of a mounting device according to yet another exemplary embodiment of the invention.

FIG. 3 illustrates a cross sectional view of a mounting device 100 according to yet another exemplary embodiment of the invention.

In contrast to the embodiments of FIG. 1 and FIG. 2, a layer-shaped thermal expansion adjustment structure 106 according to FIG. 3 contacts on one side the electrically insulating structure 104 and is separated on the opposing other side from a layer-shaped electrically conductive structure 102 by a layer-shaped adhesion promoting structure 108.

Furthermore, the electrically conductive structure 102 comprises cylindrical post-shaped vias electrically connecting further electrically conductive structures 110 in the form of patterned copper layers on both opposing main surfaces of the mounting device 100 to one another. The vias are separated from electrically insulating structure 104 by a respective hollow cylindrical thermal expansion adjustment structure 106 in direct contact with the electrically insulating structure 104 and by a respective hollow cylindrical adhesion promoting structure 108 in direct contact with the hollow cylindrical thermal expansion adjustment structure 106 and the respective post-shaped via. Thus, both thermal expansion adjustment and increase of the thermal conductivity may be accomplished at multiple positions within the mounting device 100 to thereby obtain a multi position warpage suppression and promotion of heat removal.

FIG. 4 illustrates a phase diagram 400 indicating contributions of $sp^2$ hybridized carbon, $sp^3$ hybridized carbon and hydrogen of a carbon comprising thermal expansion adjustment structure 106 of a mounting device 100 according to an exemplary embodiment of the invention, wherein mechanical and thermal properties of the mounting device 100 may be adjusted by configuring a manufacturing procedure in accordance with a desired section of the phase diagram 400.

According to the phase diagram 400, the thermal expansion adjustment structure 106 of diamond like carbon (DLC) is a hydrogen (H) comprising amorphous carbon coating with a mixture of $sp^2$ and $sp^3$ hybridized carbon. Preferably, the portion of $sp^2$ hybridized carbon is in a range between 40 and 60 weight percent of the thermal expansion adjustment structure 106, the portion of $sp^3$ hybridized carbon is in a range between 25 and 40 weight percent of the thermal expansion adjustment structure 106, and the percentage of hydrogen is above 10 weight percent (preferably not above 40 weight percent). When the thermally conductive and electrically insulating thermal expansion adjustment structure 106 is formed by sputtering/physical vapor deposition (PVD), the percentage of $sp^2$ hybridized carbon is high. When however plasma enhanced chemical vapor deposition (PECVD) is used for forming the thermal expansion adjustment structure 106, a higher hydrogen percentage is obtained. With a high percentage of $sp^2$ hybridized and $sp^3$ hybridized carbon, a high thermal conductivity of the thermal expansion adjustment structure 106 may be obtained, and an appropriate coefficient of thermal expansion may be fine-tuned. With a high hydrogen percentage, a mechanically stable thermal expansion adjustment structure 106 is obtained. By a selection of the manufacturing procedure (for instance also adjustment of the precise process parameters and/or, if desired, a combination of the above-mentioned manufacturing procedures), the mechanical and thermal properties of the thermal expansion adjustment structure 106 may be precisely set. A particularly appropriate composition in terms of the mechanical and thermal properties is shown in FIG. 4 with an area denoted with reference numeral 402.

In an exemplary embodiment of the invention in which the thermal expansion adjustment structure is formed of diamond like carbon, a mixture of $sp^2$ and $sp^3$ hybridized carbon of the thermal expansion adjustment structure 106 is adjusted so (in particular using the phase diagram 400 of FIG. 4) that the thermally induced warpage of the mounting device 100 resulting from the difference between the above mentioned first value and the second value is at least partially compensated by the thermal expansion adjustment structure 106.

Figure 5:
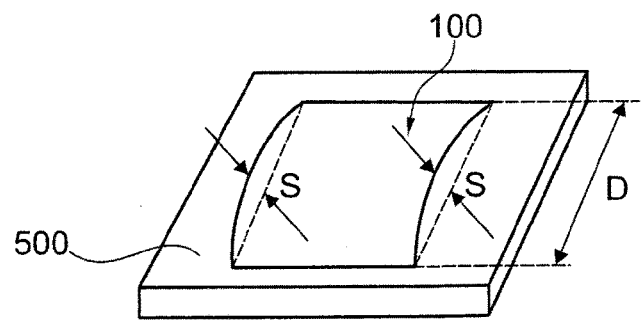
FIG. 5 illustrates a three-dimensional view of a mounting device according to an exemplary embodiment of the invention having a bow-type warpage of a still acceptable extent and lying on a flat support.

FIG. 5 illustrates a three-dimensional view of a mounting device 100 according to an exemplary embodiment of the invention having a bow-type warpage of a still acceptable extent and lying on a flat support 500.

In the event of a purely bow type warpage, all four corners of the rectangular mounting device 100 are placed at the same level, i.e. are in contact with the planar support 500.

In an embodiment, the thermal expansion adjustment structure 106 is configured so that the thermally induced warpage is characterized by a bow of the mounting device 100 of at the maximum 1.5% (in particular at the maximum 0.7%). The bow value is calculated as a ratio between a maximum distance, s, between a bottom surface of the mounting surface 100 and a planar support 500 carrying the mounting device 100 on the one hand and a length, D, of a longest side of the mounting device 100 on the other hand. In other words, the bow value is calculated as s/D.

Figure 6:
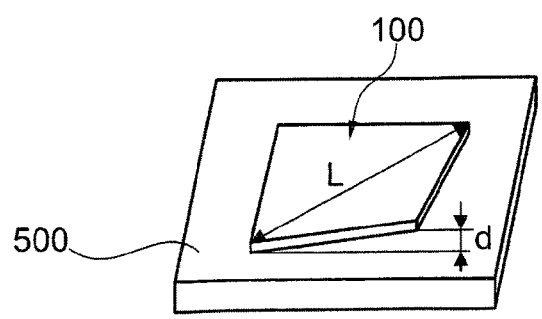
FIG. 6 illustrates a three-dimensional view of a mounting device according to an exemplary embodiment of the invention having a twist-type warpage of a still acceptable extent and lying on a flat support.

FIG. 6 illustrates a three-dimensional view of a mounting device 100 according to an exemplary embodiment of the invention having a twist-type warpage of a still acceptable extent and lying on a flat support 500.

In the event of a purely twist type warpage, only three corners of the rectangular mounting device 100 are placed at the same level, i.e. are in contact with the planar support 500, whereas the fourth corner is spaced with regard to the flat surface of the support 500.

In an embodiment, the thermal expansion adjustment structure 106 is configured so that the thermally induced warpage is characterized by a twist of the mounting device 100 of at the maximum 2% (in particular at the maximum 1%). The twist is calculated as a ratio between a maximum distance, d, between the above-mentioned fourth corner of the mounting surface 100 and a planar support 500 carrying the mounting device 100 on the one hand and a longest diameter, L, of the mounting device 100 on the other hand. In other words, the twist value is calculated as d/L.

It has turned out that the above mentioned values of bow and twist, even when taken in combination, still provide an acceptable quality of the mounting device 100. The thermal expansion adjustment structure 106 may hence be configured so as to reduce the twist and bow values to fall below the given tolerable threshold values to obtain a mounting device 100 of sufficient quality.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A mounting device for mounting electronic components, wherein the mounting device comprises:
   an electrically conductive structure having a first value of thermal expansion in at least one pre-defined spatial direction;
   an electrically insulating structure having a second value of thermal expansion in the at least one pre-defined spatial direction being different from the first value and being arranged on the electrically conductive structure;
   a thermal expansion adjustment structure having a third value of thermal expansion in the at least one pre-defined spatial direction;
   wherein the third value is selected and the thermal expansion adjustment structure is located so that thermally induced warpage of the mounting device resulting from a difference between the first value and the second value is at least partially compensated by the thermal expansion adjustment structure;
   wherein the third value is selected to be smaller than both the first value and the second value.

2. The mounting device according to claim 1, configured as a plate with a thickness extending in z-direction and having a length in x-direction and a width in y-direction being both larger than the thickness.

3. The mounting device according to claim 2, wherein the at least one predefined spatial direction comprises at least one of the x-direction, the y-direction, and the z-direction.

4. The mounting device according to claim 1, wherein the thermal expansion adjustment structure comprises or consists of one of the group consisting of diamond like carbon, a nitride, and an oxide.

5. The mounting device according to claim 1, wherein the electrically conductive structure, the electrically insulating structure, and the thermal expansion adjustment structure constitute a layer stack.

6. The mounting device according to claim 1, wherein the thermal expansion adjustment structure is embedded between different spatially separated sections of the electrically conductive structure.

7. The mounting device according to claim 1, further comprising an adhesion promoting structure arranged between the thermal expansion adjustment structure and the electrically conductive structure and configured for promoting adhesion of the thermal expansion adjustment structure on the electrically conductive structure.

8. The mounting device according to claim 7, wherein the mounting device comprises at least one of the following features:
   the adhesion promoting structure extends over only a part of the surface of or over the entire surface of at least one of the electrically conductive structure and the thermal expansion adjustment structure; the adhesion promoting structure comprises or consists of at least one of the group consisting of titanium, tungsten, chromium, a carbide builder, a carbon composite, graphene, and a monolayer graphene.

9. The mounting device according to claim 1, wherein the electrically conductive structure comprises two spatially separated sections arranged on two opposing sides of the thermal expansion adjustment structure, and the electrically insulating structure comprises two spatially separated sections arranged on two opposing sides of the two sections of the electrically conductive structure.

10. The mounting device according to claim 9, wherein the two sections of the electrically conductive structure, the two sections of the electrically insulating structure, and the thermal expansion adjustment structure form a symmetric arrangement.

11. The mounting device according to claim 1, wherein the mounting device comprises at least one of the following features:
   the thermal expansion adjustment structure is made of a thermally conductive and electrically insulating material;
   the thermal expansion adjustment structure is made of a material having a value of the thermal conductivity of at least 2 W/m K.

12. The mounting device according to claim 1, wherein the electrically insulating structure is made of a material having anisotropic properties in terms of thermal expansion.

13. The mounting device according to claim 1, comprising at least one of the following features:
   at least one further electrically conductive structure;
   at least one further electrically insulating structure on the electrically insulating structure and the electrically conductive structure.

14. The mounting device according to claim 1, configured as one of the group consisting of a printed circuit board, an interposer, a substrate, and a multilayer substrate.

15. The mounting device according to claim 1, wherein the mounting device comprises at least one of the following features:
   the thermal expansion adjustment structure is configured so that the thermally induced warpage is characterized by a bow of the mounting device of at the maximum 1.5%, wherein the bow is calculated as a ratio between a maximum distance between a bottom surface of the mounting surface and a planar support carrying the mounting device on the one hand and a length of a longest side of the mounting device on the other hand;
   the thermal expansion adjustment structure is configured so that the thermally induced warpage is characterized by a twist of the mounting device of at the maximum 2%, wherein the twist is calculated as a ratio between a maximum distance between a corner of the mounting surface and a planar support carrying the mounting device on the one hand and a longest diameter of the mounting device on the other hand;
   the thermal expansion adjustment structure is configured as a partial layer having, in a viewing direction perpendicular to a main surface of the mounting device, a total area being smaller than a surface area of the main surface of the mounting device.

16. A method of manufacturing a mounting device for mounting electronic components, wherein the method comprises:
   providing an electrically conductive structure having a first value of thermal expansion in at least one pre-defined spatial direction;
   arranging an electrically insulating structure on the electrically conductive structure, the electrically insulating structure having a second value of thermal expansion in the at least one pre-defined spatial direction being different from the first value;
   forming a thermal expansion adjustment structure having a third value of thermal expansion in the at least one pre-defined spatial direction;
   selecting the third value and locating the thermal expansion adjustment structure so that thermally induced warpage of the mounting device resulting from a difference between the first value and the second value is at least partially compensated by the thermal expansion adjustment structure;
   wherein the third value is selected to be smaller than both the first value and the second value.

17. The method according to claim 16, wherein the thermal expansion adjustment structure is formed by one of the group consisting of physical vapor deposition, cathodic arc deposition, chemical vapour deposition, plasma enhanced chemical vapour deposition, and printing.

18. The method according to claim 16, wherein the third value is selected so that the electrically conductive structure and the thermal expansion adjustment structure as a composite have an effective value of the thermal expansion in the at least one pre-defined spatial direction which is closer to the second value than the first value.

19. The method according to claim 16, wherein the method comprises:
   estimating thermally induced warpage of a mounting device without a thermal expansion adjustment structure;

estimating thermally induced warpage of a to-be-designed-mounting device having a thermal expansion adjustment structure;

modifying the third value of the thermal expansion adjustment structure and/or modifying location of the thermal expansion adjustment structure in the to-be-designed-mounting device until an estimated thermally induced warpage of the to-be-designed-mounting device meets at least one predefined quality criterion in term of warpage characteristics;

manufacturing the to-be-designed-mounting device meeting the at least one predefined quality criterion.

20. The method according to claim 16, wherein the thermal expansion adjustment structure is formed of diamond like carbon, wherein a mixture of $sp^2$ and $sp^3$ hybridized carbon of the thermal expansion adjustment structure is adjusted so that the thermally induced warpage of the mounting device resulting from the difference between the first value and the second value is at least partially compensated by the thermal expansion adjustment structure.

* * * * *